United States Patent
Matsubara

[19]

[11] Patent Number: 6,144,613
[45] Date of Patent: Nov. 7, 2000

[54] SYNCHRONOUS SEMICONDUCTOR MEMORY

[75] Inventor: Yasushi Matsubara, Tokyo, Japan

[73] Assignee: NEC Corporation, Tokyo, Japan

[21] Appl. No.: 09/329,716

[22] Filed: Jun. 10, 1999

[30] Foreign Application Priority Data

Jun. 11, 1998 [JP] Japan .................................. 10-163434

[51] Int. Cl.[7] .................................................. G11C 8/00
[52] U.S. Cl. .......................................... 365/233; 365/194
[58] Field of Search ................................... 365/233, 194, 365/239, 189.05; 327/296

[56] References Cited

U.S. PATENT DOCUMENTS

| 5,581,512 | 12/1996 | Kitamura . |
| 5,812,490 | 9/1998 | Tsukude .................................. 365/233 |
| 5,880,998 | 3/1999 | Tanimura et al. .................. 365/189.05 |
| 5,898,331 | 4/1999 | Fujjita ..................................... 327/296 |
| 5,901,101 | 5/1999 | suzuki et al. ........................... 365/222 |

FOREIGN PATENT DOCUMENTS

| 0 640 981 | 3/1995 | European Pat. Off. . |
| 0 732 699 | 9/1996 | European Pat. Off. . |
| 6-290583 | 10/1994 | Japan . |

Primary Examiner—David Nelms
Assistant Examiner—Thong Le
Attorney, Agent, or Firm—Darryl G. Walker

[57] ABSTRACT

According to one embodiment (100), a synchronous semiconductor memory may include a first initial circuit (102), second initial circuit (104) and third initial circuit (106). The first initial circuit (102) can receive an external clock signal CLK and compare the external clock signal CLK to a reference voltage VREF. The comparison result can be amplified and output as a signal $\phi 1$. The second initial circuit (104) can receive a clock control signal CKE and compare the clock control signal CKE to a reference voltage VREF. The comparison result can be amplified and output as a signal $\phi 2$. The third initial circuit (106) can receive the external clock signal CLK, and is activated by a control signal $\phi 7$ that can correspond to the clock enable signal CKE. The third initial circuit (106) can compare the external clock signal CLK to a reference voltage VREF, and amplify and output the comparison result $\phi 8$. The embodiment (100) can further include a first control circuit (108) that can receive the $\phi 1$ signal and generate a period signal $\phi 3$ having a constant pulse width that varies in synchronism with the external clock signal CLK. In addition, the first control circuit (108) can receive the $\phi 8$ signal and generate an internal clock signal $\phi 5$.

20 Claims, 5 Drawing Sheets

SYNCHRONOUS SEMICONDUCTOR MEMORY

TECHNICAL FIELD

The present invention relates generally to synchronous semiconductor memories, and more particularly to semiconductor memories having power-down controls.

BACKGROUND OF THE INVENTION

The increased operating speed of central processing units (CPUs) and other peripheral large scale integrated (LSI) circuits has led to the wider use of synchronous semiconductor memory devices. Synchronous semiconductor memories are usually high-speed memories that can execute "burst" operations in synchronism with an external clock signal. Burst operations can allow access to multiple memory locations with the application of a single address. Synchronous memories can include dynamic random access memories (DRAMs) and static RAMs (SRAMs), to name just two examples.

Conventional synchronous semiconductor memories may receive various input signals. Input signals may include a clock signal CLK and a clock enable signal CKE. In addition, other input signals may include address signals groups (A0 to An), input/output data groups (DQ0 to DQm), a row address strobe signal RAS, a column address strobe signal CAS, and a write enable signal WE.

Synchronous semiconductor memories can generate an internal clock signal having a constant pulse width that corresponds to the external clock signal CLK and the clock enable signal CKE. A synchronous semiconductor memory can operate in synchronism with such an internal clock signal. Control commands may be entered by the application of various external input signals in synchronism with the external clock signal. As just one example, control commands may be entered that result in a burst mode of operation.

In addition to executing various operations in response to various control commands, synchronous memories may also be capable of switching to a "power-down" mode according to the application of an external signal, such as a CKE signal. A power-down mode may reduce the power consumption of a synchronous memory.

Referring now to FIG. 8, a block diagram is set forth showing a clock control section of a conventional synchronous semiconductor memory. The clock control section is disclosed in, as one example, Japanese Patent Application Laid-Open (Kokai) No. Hei 6-290583. In FIG. 8, the clock control section of the conventional synchronous semiconductor memory is designated by the general reference character 800, and includes first and second initial circuits (802 and 804), and first, second, and third control circuits (806, 812 and 818, respectively). The conventional clock control section 800 receives an external clock signal CLK as well as a clock enable signal CKE. In response to the various input signals, the conventional clock control section generates an internal clock signal $\phi5$ and a control signal $\phi7$. The $\phi5$ and $\phi7$ signals may be supplied to other internal circuits of the synchronous semiconductor memory.

As shown in FIG. 8 the clock control circuit is designated by the general reference character 800, and is shown to include a first initial circuit 802 that may receive the external clock signal CLK, and compare it with a reference voltage VREF. The comparison result is then amplified and output as a signal $\phi1$. A second initial circuit 804 may receive the clock enable signal CKE, and compare it with a reference voltage VREF. The comparison result is then amplified and output as a signal $\phi2$. The first and second initial circuits (802 and 804) may include transistors arranged in a current mirror configuration with a pair of compare transistors.

A first control circuit is set forth in FIG. 8 by the reference character 806, and is shown to include a first one-shot signal generating circuit 808 and a second one-shot signal generating circuit 810. The first one-shot signal generating circuit 808 generates a period signal $\phi3$. Period signal $\phi3$ can have a constant pulse width, and may vary periodically in synchronism with the external clock signal CLK. The second one-shot signal generating circuit 810 receives signal $\phi1$ and another signal $\phi4$, and generates an internal clock signal $\phi5$. Internal clock signal $\phi5$ can have a constant pulse width, and may be mask-controlled in synchronism with the external clock signal CLK and the clock enable signal CKE. The internal clock signal $\phi5$ may be considered mask-controlled in that the internal clock signal $\phi5$ may be synchronous with the CLK signal in response to a CKE signal of a first logic value, but may be maintained at a constant logic value in response to a CKE signal of a second logic value.

The period signal $\phi3$ and internal clock signal $\phi5$ may be designed to have low pulse widths of the same length. Further, the signals $\phi3$ and $\phi5$ can be utilized to control the synchronous operation of other circuits. For example, period signal $\phi3$ can be designed to drive a second control circuit 812, while internal clock signal $\phi5$ can be designed to drive all other internal circuits (not shown).

In a power-down mode, the CKE signal can transition to a low value. One cycle following such a CKE signal transition, internal clock signal $\phi5$ can be placed in an inactive (high, for example) logic level. As a result, the synchronous operation of the internal circuits can stop, thereby reducing current consumption.

The second control circuit 812 of the conventional clock control section 800 is shown to include a D-type flip-flop 814 and a D-type latch circuit 816. The D-type flip-flop 814 can receive the signal $\phi2$ as one input, and provide a signal $\phi6$ as an output, in synchronism with the period signal $\phi3$. The $\phi6$ signal can be delayed with respect to the $\phi3$ signal.

The D-type latch circuit 816 can receive the $\phi6$ signal and output the signal $\phi4$ with a further delay of a half-cycle, in synchronism with the period signal $\phi3$.

The conventional clock circuit 800 also includes a third control circuit 818. The third control circuit 818 can include a logic circuit that receives the $\phi2$, $\phi4$ and $\phi6$ signals and provides a control signal $\phi7$. The control signal $\phi7$ can become active (low, for example) immediately following a low-to-high transition in the clock enable signal CKE. The control signal $\phi7$ may then become inactive (high, for example) one cycle following a high-to-low transition in the clock enable signal CKE. The control signal $\phi7$ may be utilized by other initial circuits (not shown). Such other initial circuits can compare other external input signals with a reference signal voltage VREF, and then amplify the comparison result.

A brief description will now be given of the operation of a conventional clock control section of a semiconductor memory set forth in FIG. 8.

The conventional synchronous memory can receive the system clock of the device (such as the external clock signal CLK), as well as the clock enable signal CKE, for controlling the power-down mode. The CLK and CKE signals are compared within the first and second initial circuits (802 and 804, respectively) to a reference signal voltage VREF. The comparison results are amplified and output as the signals φ1 and φ2, respectively.

The signals φ1 and φ2 are received by the first and second control circuits (806 and 812, respectively). Within the first control circuit 806, the first one-shot generating circuit 808 receives the φ1 signal, and in response thereto, outputs the period signal φ3. In the example of FIG. 8, the period signal φ3 can have a constant pulse width and vary in synchronism with the signal φ1. The period signal φ3 is output to the second control circuit 812.

The D-type flip-flop and D-type latch (814 and 816) delay the signal φ2 in synchronism with the period signal φ3 to generate output signal φ6. The signal φ2 can be delayed further to generate the φ4 signal, which can be delayed by a half clock cycle with respect to the φ6 signal.

The third control circuit 818 generates the control signal φ7 in response to the φ2, φ6, and φ4 signals. The control signal φ7 will become active (low, for example) essentially immediately after the clock enable signal CKE transitions high. The control signal φ7 will become inactive (high, for example), essentially one clock cycle after the clock enable signal CKE transitions low.

When the control signal φ7 becomes low essentially immediately after the clock enable signal CKE transitions high, other initial circuits (not shown) can be activated. The other initial circuits can compare external input signals with a reference signal voltage VREF, and then amplify and output the comparison results. In addition, following a low-to-high transition in the clock enable signal CKE, the φ4 signal can transition low. Such a transition in the φ4 signal may occur as much as about one clock cycle following a transition in the CKE signal.

Within the second one-shot signal generating circuit 810, the resulting φ1 and φ4 signals allow internal clock signal φ5 to be generated. Internal clock signal φ5 can be activated about one clock cycle following a low-to-high transition in the clock enable signal CKE. The internal clock signal φ5 may be supplied to internal circuits (not shown) to allow such circuits to operate in synchronism with the external clock signal CLK.

In this way, a synchronous semiconductor memory can input external input signals, such as address signal groups A0 to An, input/output data groups DQ0 to DQm, a RAS signal, a CAS signal and a WE signal, to name a few examples. Such external input signals can be input in synchronism with the rising edge of the external clock signal CLK. By inputting such external input signals, the synchronous semiconductor memory can execute control commands obtained by particular combinations of such external input signals.

A conventional synchronous semiconductor memory can also have a power-down mode. A power down mode may be entered by the clock enable signal CKE transitioning from an active level (high, for example) to an inactive level (low, for example). When the clock enable signal CKE transitions low, the signals φ4 and φ7 transition high, with a delay of about one cycle. The signal φ4, which mask controls the internal clock signal φ5, enables the internal clock signal φ5 to become inactive (high, for example). A high internal clock signal φ5 can essentially stop the active operation of internal circuits, placing the synchronous semiconductor memory in a power-down mode.

Within the third control circuit 818, the resulting φ2, φ4 and φ6 signals can result in the control signal φ7 being driven to an inactive level (high, for example). An inactive control signal φ7 can result in other initial circuits being placed in an inactive state.

In this way, a synchronous semiconductor memory that is executing control commands can be stopped by a transition in the clock enable signal CKE. In the event the synchronous semiconductor memory includes complementary metal-oxide-semiconductor (CMOS) circuits, such CMOS circuits can hold current data. Further, current consumption, due to the charging and discharging of various nodes, can be essentially eliminated. In addition, other initial circuits (that can receive other external input signals) are also disabled, and consume essentially no current.

While conventional synchronous semiconductor memories can provide a power down mode, it is still desirable to arrive at some way of further reducing current consumption. Further reductions in current consumption in a power-down mode are desirable as a synchronous semiconductor memory may be utilized in a portable device that is powered by one or more batteries. By reducing power consumption, battery lifetime can be increased.

It is difficult to reduce the current consumption of the conventional clock control circuit 800 because the internal clock signal φ5, which is the main timing signal for the internal circuits, typically drives a relatively large load. In addition, devices within the first initial circuit 802, such as transistors, must be relatively large, as the φ1 signal must be supplied to two circuit stages (i.e., the first and second one-shot signal generating circuits 808 and 810). Another reason power can be consumed arises from the first initial circuit 802. While internal circuits may be suspended in a power-down mode, the first initial circuit 802 may continue to compare the periodic external clock signal CLK to a reference voltage VREF, and amplify the result to generate the signal φ1. Such periodic comparing and amplifying can continue to consume current, and hence consume power.

It would be desirable to arrive at a clock control circuit for a synchronous semiconductor device that can reduce current consumption over conventional approaches. Such a clock control circuit could provide more advantageous power consumption characteristics and/or increase battery life for portable systems that include such synchronous semiconductor devices.

SUMMARY OF THE INVENTION

It is an object of the invention to reduce the current consumption in a synchronous semiconductor memory that receives an external clock signal over a continuous period of time.

According to the disclosed embodiments of the invention, a synchronous semiconductor memory can receive an external clock signal and a clock enable signal, and in response thereto, generate an internal clock signal. The synchronous semiconductor memory can operate internally in synchronism with the internal clock signal, and may comprise a first initial circuit that can receive the external clock signal, compare the external clock signal to a reference voltage, and provide the comparison result as an output, a second initial circuit that can receive the clock enable signal, compare the clock enable signal to a reference voltage, and provide the comparison result as an output, a third initial circuit that can receive the external clock signal and is enabled by a control signal corresponding to the clock enable signal, the third initial circuit, when enabled, comparing the external clock signal with a reference voltage, and providing the comparison result as an output, and a first control circuit that receives the output of the first initial circuit and can generate a period signal which varies in synchronism with the external clock signal, the first control circuit also receiving the output of the third initial circuit and generating the internal clock signal in response thereto.

According to one aspect of the disclosed embodiments, the internal clock signal and/or the period signal can have a constant pulse width.

According to another aspect of the disclosed embodiments, the synchronous semiconductor memory can execute control commands according to combinations of external input signals that are received in synchronism with the external clock signal.

According to another aspect of the disclosed embodiments, the first initial circuit, and/or second initial circuit and/or third initial circuit can amplify their respective comparison results.

According to another aspect of the disclosed embodiments, within the synchronous semiconductor memory, transistors within the first initial circuit can be smaller than transistors within the third initial circuit.

According to another aspect of the disclosed embodiments, a synchronous semiconductor memory can further include a second control circuit that receives the output of the second initial circuit, and generates an output signal in synchronism with the period signal. The outputted signal can be delayed by predetermined clock cycle(s), or clock cycle portion(s).

According to another aspect of the disclosed embodiments, the first control circuit may comprise
a first one-shot signal generating circuit that can generate a one-shot signal in correspondence with the output of the first initial circuit, the one-shot signal may be the period signal and include a series of pulses having a constant width, and
a second one-shot signal generating circuit that can generate a one-shot signal in correspondence with the outputs of the third initial circuit and second control circuit, the one-shot signal may be the internal clock signal.

According to another aspect of the disclosed embodiments, the dimensions of transistors within the first one-shot generating circuit can be smaller than transistors within the second one-shot generating circuit.

According to another aspect of the disclosed embodiments, the synchronous semiconductor memory may include at least one other initial circuit that can receive one or more external input signals and compare the external input signals with a reference voltage to provide an output signal. The other initial circuit can be activated by the control signal.

DETAILED DESCRIPTION OF THE EMBODIMENTS

Various embodiments of the invention will now be described in conjunction with a number of drawings and a timing diagram. As in the case of a conventional synchronous semiconductor memory, a semiconductor memory according to one embodiment may receive an external clock signal CLK and a clock enable signal CKE. In addition, other external input signals may be received. Such other external input signals may include, without limitation, one or more of the following types of signals; address signal groups A0 to An, input/output data groups DQ0 to DQm, a row address strobe signal RAS, a column address strobe signal CAS, and a write enable signal WE.

The synchronous semiconductor memory can generate an internal clock signal having a constant pulse width that corresponds with the external clock signal CLK and the clock enable signal CKE. The synchronous semiconductor memory may operate in synchronism with the internal clock signal. In addition, control commands can be executed by the synchronous semiconductor memory by receiving various external input signals in synchronism with the external clock signal CLK. Control commands can include, as just one example, a burst mode of operation.

A synchronous semiconductor memory may also be capable of switching to a power-down mode in correspondence with the clock enable signal. A power-down mode may result in reduced current consumption.

Figures 1, 2:
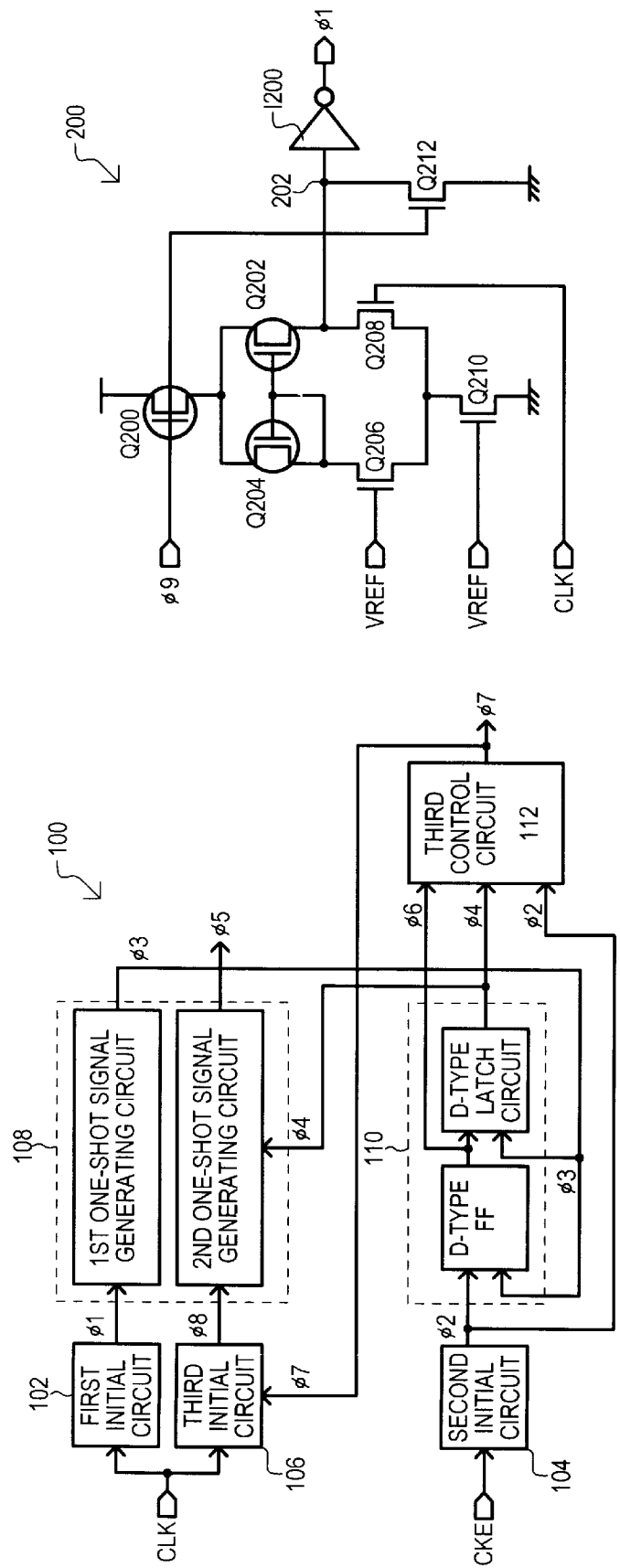
FIG. 1 is a block diagram illustrating a clock control circuit of a synchronous semiconductor memory according to one embodiment.
FIG. 2 is a circuit diagram illustrating an example of a first initial circuit that may be used in the embodiment of FIG. 1.

Referring now to FIG. 1, a clock control circuit for a synchronous semiconductor memory is set forth in a block diagram. The clock control circuit is designated by the general reference character 100, and is shown to include a first initial circuit 102, a second initial circuit 104, a third initial circuit 106, a first control circuit 108, a second control circuit 110, and third control circuit 112. The clock control circuit 100 can receive an external clock signal CLK and a clock enable signal CKE and generate an internal clock signal φ5 and a control signal φ7. The internal clock signal φ5 and control signal φ7 may be supplied to other internal circuits of a synchronous semiconductor memory device.

FIG. 2 is a circuit diagram that shows an example of a first initial circuit according to one embodiment. The first initial circuit is designated by the general reference character 200 and may include p-channel field effect transistors (FETs) Q200–Q204, as well as n-channel FETs Q206–Q210. The FETs may be insulated gate FETs (IGFETs), such as metal-oxide-semiconductor type FETs (MOSFETs), as just one example. Transistors Q204 and Q202 can form a current mirror. Arranged in parallel with the current mirror Q204/Q202 are transistor Q206 and Q208, which can be conceptualized as compare transistors. The gate of transistor Q206 can receive a reference voltage VREF while the gate of transistor Q208 can receive the external clock signal CLK.

Enable transistor Q200 couples the sources of transistors Q202 and Q204 to a first power supply voltage. The gate of enable transistor Q200 can receive a φ9 signal, which is typically low. Reference transistor Q210 is coupled between the sources of transistors Q206 and Q208 and a second power supply voltage. The gate of reference transistor Q210 can receive the reference voltage VREF.

One skilled in the art would recognize that in the arrangement of FIG. 2, differences in potential between the external clock signal and VREF potential will result in changes at a compare output node 202 formed at the drain-drain connection of transistors Q202 and Q208. The potential at the compare output node 202 is supplied as an input to an inverter I200. The output of the inverter I200 is a first initial output signal φ1.

The first initial circuit 200 also includes a disable transistor Q212 disposed between the compare output node 202 and the second power supply voltage. The gate of disable transistor Q212 can receive the φ9 signal.

Figure 8:
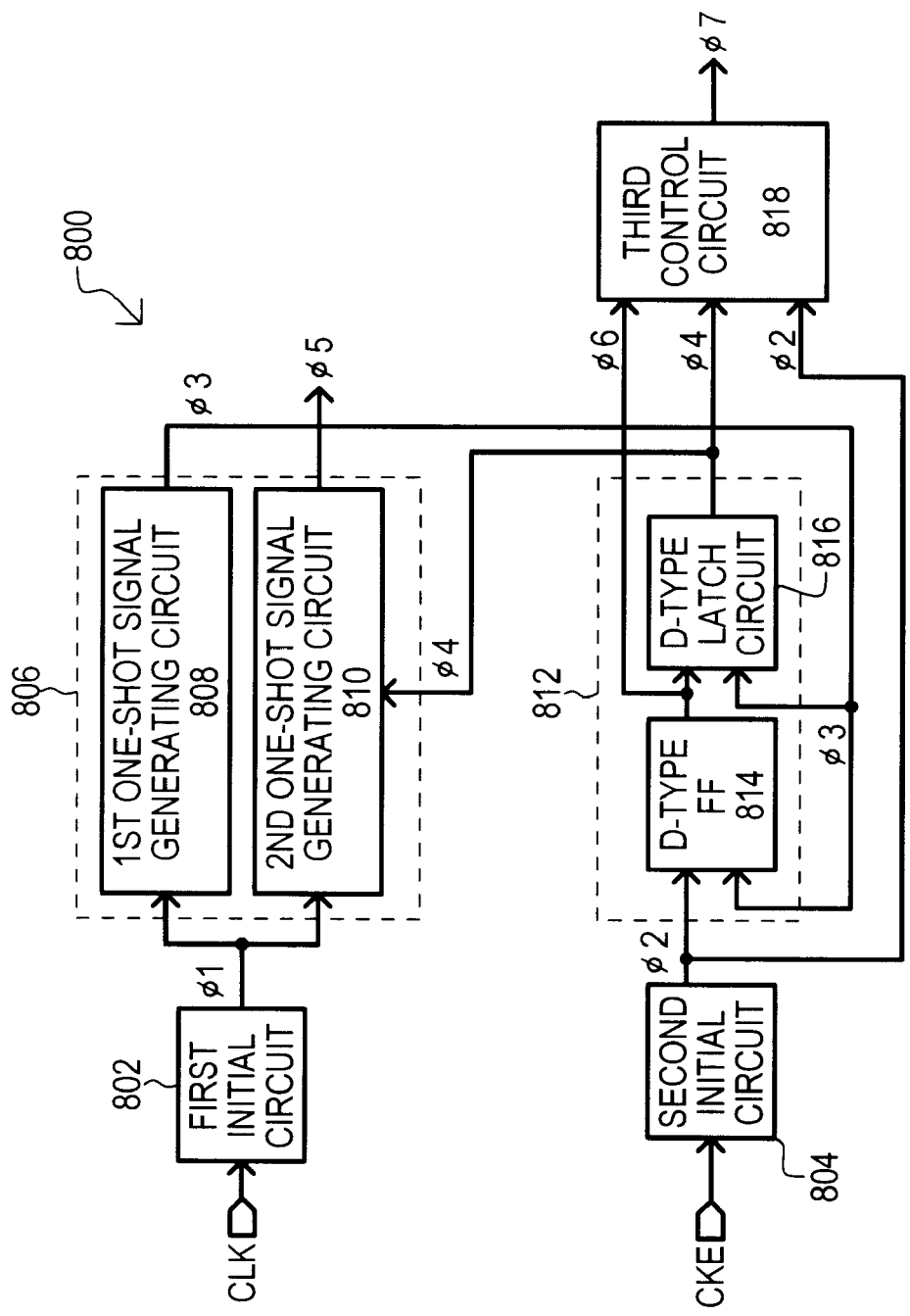
FIG. 8 is a block diagram of a clock control according to a conventional synchronous semiconductor memory.

The first initial circuit 200 may thus include an arrangement that is similar in some ways to the first initial circuit of the conventional example set forth in FIG. 8.

A first initial circuit according to the embodiments may receive the external clock signal CLK, compare it with a reference voltage VREF, and then amplify the comparison result. The amplified comparison result is the first initial output signal φ1. The first initial output signal φ1 can be supplied to a first one-shot signal generating circuit in the first control circuit 108.

One way in which the first initial circuit 200 may differ from that of a conventional clock control circuit, is in the size of its devices (e.g., transistors). As just one example, field effect transistor (FET) widths can be smaller than in a conventional approach. Such a reduction in transistor size can be achieved because the first initial circuit 200 does not have to drive both a first and a second one-shot signal generating circuit, as is in the conventional case illustrated in FIG. 8. As just one example, MOSFET transistors Q200, Q202, Q204, Q206, Q208, Q210 and Q212 can include channel widths of 32 μm, 6.8 μm, 3.4 μm, 6.8 μm, 13.6 μm, 3.3 μm, and 2 μm, respectively.

Referring back to FIG. 1, the second initial circuit 104 according to one embodiment can be a circuit that is generally equivalent to the first initial circuit set forth in FIG. 2. The second initial circuit 104 can perform the same general function as the conventional second initial circuit set forth in FIG. 8. To avoid undue repetition, a description of the second initial circuit is not included.

Figures 3, 4:
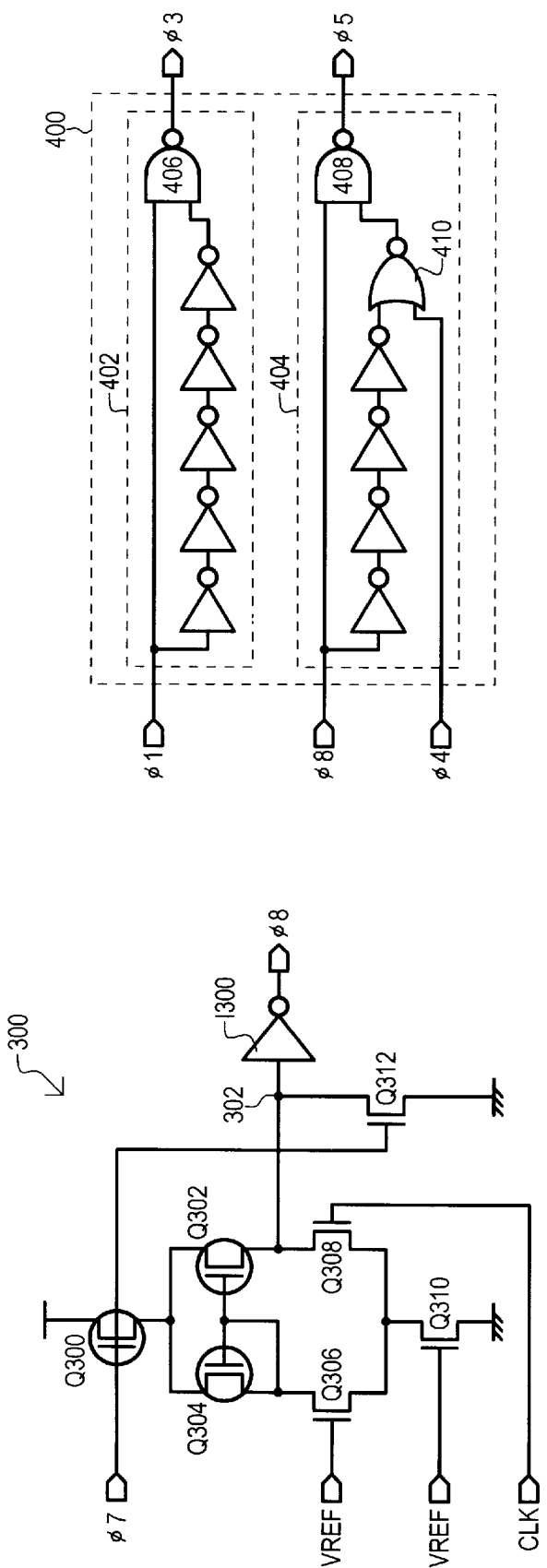
FIG. 3 is a circuit diagram illustrating an example of a third initial circuit that may be used in the embodiment of FIG. 1.
FIG. 4 is a circuit diagram illustrating an example of a first control circuit that may be used in the embodiment of FIG. 1.

FIG. 3 is a circuit diagram that shows an example of a third initial circuit according to one embodiment. The third initial circuit is designated by the general reference character 300, and may include a transistor arrangement that is the same as the first initial circuit 200 of FIG. 2. As shown in FIG. 3, a third initial circuit 300 can include transistors in a current mirror configuration (Q302/Q304), compare transistors (Q306 and Q308), an enable transistor Q300, a reference transistor Q310, and a disable transistor Q312. Further, a compare output node 302 is supplied as an input to an inverter I300. The output of inverter I300 may be a third initial output signal φ8.

The third initial circuit 300 can receive the external clock signal CLK. In addition, the third initial circuit can be activated by the control signal φ7. Control signal φ7 can correspond to the clock enable signal CKE. Accordingly, when activated by an active (low, for example) control signal φ7, the third initial circuit 300 can compare the CLK signal to a reference voltage, such as VREF. The comparison result can be amplified and then output as the third initial output signal φ8. The third initial output signal φ8 can be provided as an input to a second one-shot signal generating circuit within the first control circuit 108.

The third initial circuit 300 may differ from the first initial circuit 200 in that it can be activated according to the φ7 signal. In addition, the size of the devices (e.g., transistors) within the third initial circuit 300 can be larger than those within the first initial circuit 200. For example, FET widths of transistors within the third initial circuit 300 may be larger than those of the first initial circuit 200. As a more particular example, if a first initial circuit 200 has MOSFET transistors Q200, Q202, Q204, Q206, Q208, Q210 and Q212 with channel widths of 32 μm, 6.8 μm, 3.4 μm, 6.8 μm, 13.6 μm, 3.3 μm, and 2 μm, respectively, a third initial circuit 300 can have MOSFET transistors Q300, Q302, Q304, Q306, Q308, Q310 and Q312 with channel widths of 120 μm, 26 μm, 13 μm, 26 μm, 52 μm, 12.5 μm, and 4 μm, respectively. In such an arrangement, larger transistors can be used to drive the second one-shot signal generating circuit than those transistors that are used to drive the first one-shot signal generating circuit.

Figure 5:
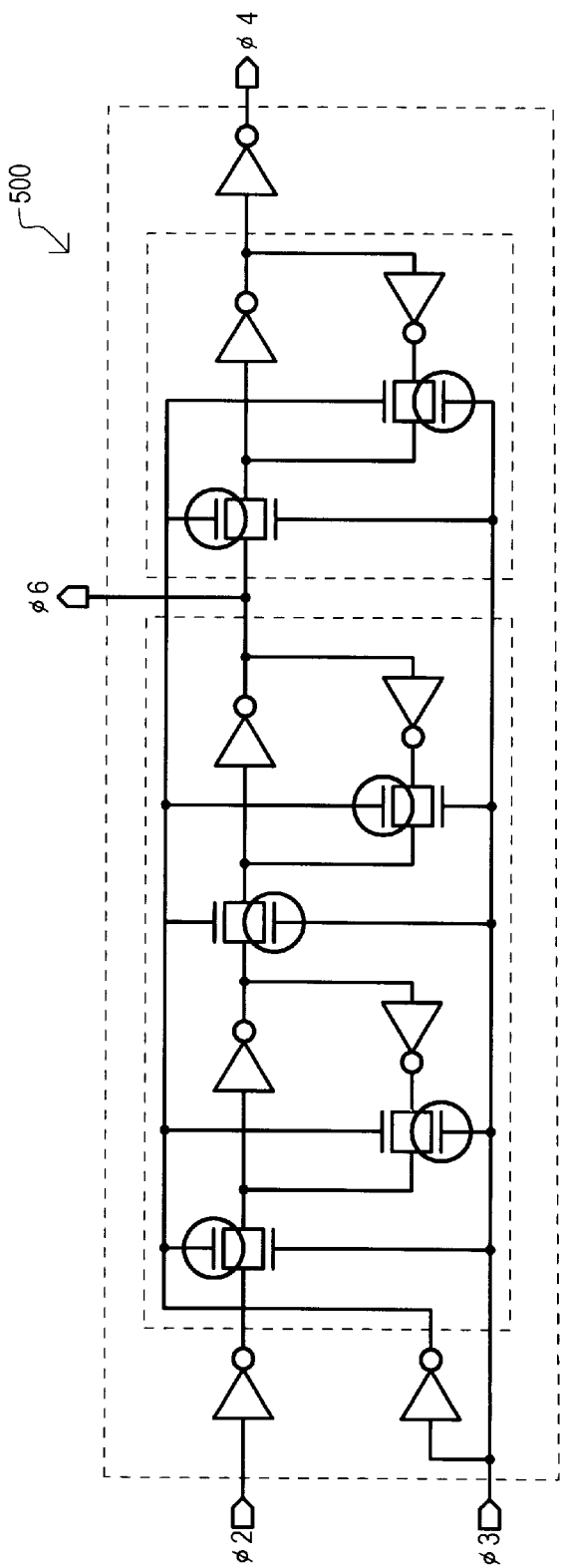
FIG. 5 is a circuit diagram illustrating an example of a second control circuit that may be used in the embodiment FIG. 1.
Figure 6:
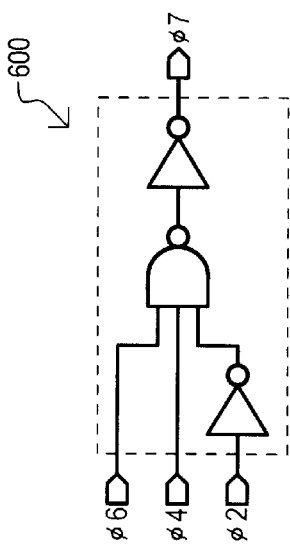
FIG. 6 is a circuit diagram illustrating an example of a third control circuit that may be used in the embodiment of FIG. 1.

FIGS. 4, 5 and 6 set forth circuit diagrams illustrating specific circuit examples for a first control circuit, second control circuit, and third control circuit, respectively, which may be used in the clock control circuit of FIG. 1. The first, second and third control circuits of FIGS. 4, 5 and 6, may have the same general functions as the first, second and third control circuits of the conventional clock control circuit of FIG. 8.

The first control circuit of FIG. 4 is designated by the general reference character 400, and is shown to include a first one-shot signal generating circuit 402 and a second one-shot signal generating circuit 404 according to one particular embodiment.

The first one-shot signal generating circuit 402 of FIG. 4 includes a first logic gate 406 having a first input that receives the first initial output signal φ1. A second input of the first logic gate 406 receives the first initial output signal φ1 by way of delay path that includes five inverters arranged in series. The delay path can serve to establish the pulse width of the period signal φ3. The particular type of first logic gate 406 in FIG. 4 is a NAND gate.

The second one-shot signal generating circuit 404 of FIG. 4 includes a second logic gate 408 having a first input that receives the third initial output signal φ8. A second input of second logic gate 408 receives the third initial output signal φ8 by way of delay path that includes four inverters arranged in series with an enable gate 410. The enable gate 410 also receives a delayed enable signal φ4 as another input. The delay path can serve to establish the width of the internal clock signal φ5. In FIG. 4, the particular type of second logic gate 408 is a NAND gate and the particular type of enable gate 410 is a NOR gate.

The first control circuit 400 according to one embodiment can include a first one-shot signal generating circuit that includes smaller sized active circuit devices than an associated second one-shot signal generating circuit. As just one example, in the event circuits are composed of FETs, transistor widths within the first one-shot signal generating circuit may be smaller than those in the associated second one-shot signal generating circuit. One skilled in the art would recognize that the logic gates and/or inverters of the first control circuit 400 can have conventional configurations.

The second control circuit of FIG. 5 has the same general arrangement as the second control circuit set forth in the cited prior art circuit. Further, the third control circuit of FIG. 6 has the same general arrangement as the third control circuit set forth in the cited prior art example. To avoid undue repetition, a detailed description of the second control circuit and third control circuit is not included.

While the above described embodiments set forth a first initial circuit, a second initial circuit, and a third initial circuit, a synchronous semiconductor memory may also include one or more other initial circuits. Such other initial circuits can compare other external input signals to a reference voltage(s). Other external input signals can include address signal groups A0 to An, input/output data groups DQ0 to DQm, a RAS signal, a CAS signal, or a WE signal, to name but a few examples. Comparison results can be amplified and output by circuits that include a current mirror circuit and accompanying compare transistors, as illustrated in FIGS. 2 and 3. These other initial circuits can be activated by the control signal φ7.

Having described examples of a clock control circuit and associated circuit examples, the operation of a clock control circuit according to an embodiment will now be described.

Figure 7:
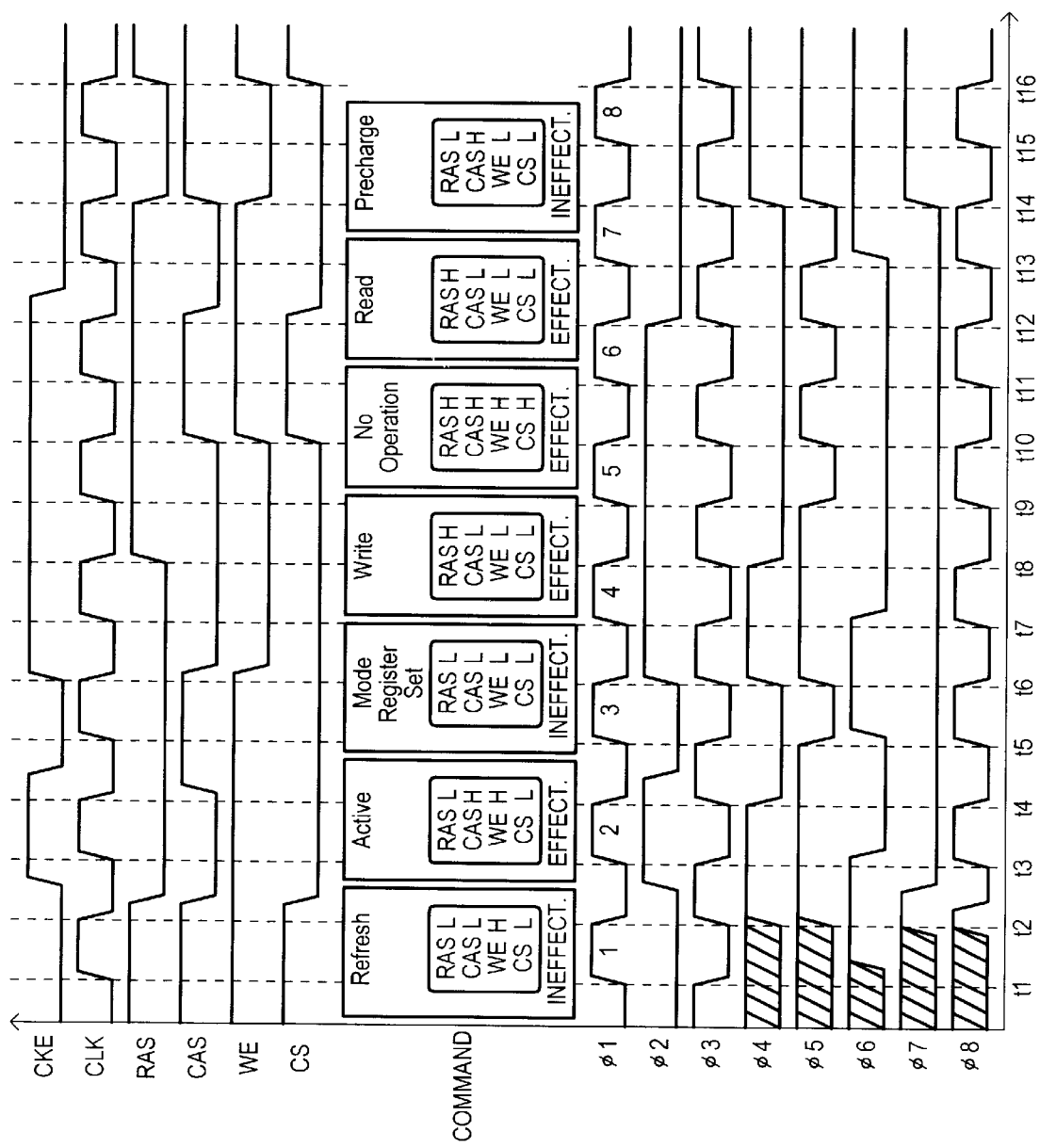
FIG. 7 is a timing diagram illustrating the operation of a semiconductor memory according to one embodiment.

FIG. 7 sets forth a timing diagram illustrating the operation of a synchronous semiconductor memory according to one embodiment. Like a conventional synchronous semiconductor memory, a synchronous semiconductor memory according to one embodiment can input a system clock as an external clock signal CLK, as well as a clock control signal CKE, for controlling a power-down mode.

According to one embodiment, a clock control circuit (such as 100) can include first and second initial circuits (such as 200). The first and second initial circuits 200 can receive the CLK and CKE signals, respectively, compare the signals to a reference voltage (such as VREF). The comparison results can be amplified and then output as signals φ1 and φ2 to the first and second control circuits (such as 400 and 500), respectively.

Within the first control circuit 400, a first one-shot signal generating circuit (such as 402) can receive the φ1 signal and generate therefrom a period signal φ3. The period signal φ3 can vary periodically in correspondence with the CLK signal. In addition, the period signal φ3 may have pulses of a constant width. The period signal φ3 can be output to the second control circuit 500.

The second control circuit 500 can delay the φ2 signal in synchronism with the period signal φ3. In this way the second control circuit 500 can generate a φ6 signal and a φ4 signal. The φ4 signal can be delayed with respect to the φ6 signal by half a clock cycle.

In response to the φ2, φ4, and φ6 signals, a control signal φ7 can become active (low, for example) after the clock enable signal CKE transitions high. In addition, the control signal φ7 can become inactive (high, for example) after a delay of up to one cycle after the clock enable signal CKE transitions low.

Referring to FIG. 7, at about times t3 and t7, the clock enable signal CKE is at a high level while the external clock signal CLK transitions from low to high. As a result, the φ7 signal transitions low essentially immediately thereafter, and is also low at time t7. The low φ7 value activates the third initial circuit, resulting in the φ8 signal being supplied to the first control circuit 400.

At about the same time, other initial circuits may be activated. Such other initial circuits can compare other external signals with a reference voltage VREF. The comparison results can be amplified and output from such other initial circuits.

The signal φ4 is delayed until the falling edge of the next cycle, and thus can transition low at about times t4 and time t8.

Within the second one-shot signal generating circuit (such as 404), the signals φ4 and φ8 allow the internal clock signal φ5 to be generated. In particular, the internal clock signal φ5 can include a low-going pulse at about times t5 and t9. The internal clock signal φ5 can thus be delayed with respect to the φ6 signal by approximately one clock cycle. Internal clock signal φ5 can be supplied to internal circuits for enabling the synchronous operation of such internal circuits.

In this way, a synchronous semiconductor memory can input external input signals in synchronism with the rising edge of the external clock signal CLK to execute control commands. External input signals can include address signal groups A0 to An, input/output data groups DQ0 to DQm, a RAS signals, a CAS signal, and a WE signal. Particular command controls can be obtained by different combinations of external input signals.

Referring once again to FIG. 7, a synchronous semiconductor memory can also be placed into a power-down mode by the clock enable signal CKE transitioning low. For example, in FIG. 7, the CKE signal transitions low prior to times t5 and t13. The signal φ4 will then transition high at about times t6 and t14 after a delay of about a clock cycle.

The internal clock signal φ5 is mask-controlled by the φ4 signal, and so becomes inactive (high) after about a clock cycle delay. In the example of FIG. 7, by times t7 and t15, internal clock signal φ5 is high.

Also set forth in the FIG. 7 is the control signal φ7. While the clock enable signal CKE is low at time t5, because the signal φ2 is high at time t6, the control signal φ7 does not transition high. Instead, the control signal φ7 is shown to transition high at about time t14, following the high-to-low transition in the CKE signal prior to time t13. When the control signal φ7 transitions high at about time t14, the third initial circuit 300, along with other initial circuits, are placed in an inactive state.

In this way, internal circuits of a synchronous semiconductor memory may execute a control command stop. As a result, the nodes of CMOS circuits within the internal circuits can hold data. Current consumption within these circuits, due to charging and discharging, can thus be reduced essentially to zero. Similarly, when the third initial circuit 300 and other initial circuits are inactive due to the high level of the control signal φ7, their current consumption is essentially reduced to zero.

As described above, a synchronous semiconductor memory according to the disclosed embodiment may generate a period signal φ3 and an internal clock signal φ5 for controlling the synchronous operation of the synchronous semiconductor memory. The period signal φ3 may drive only the second control circuit 500, while the internal clock signal φ5 can drive internal circuits of the synchronous semiconductor memory. In this arrangement, the load capacitance for the period signal φ3 may be relatively small. In contrast, the load capacitance for the internal clock signal φ5 may be relatively high. Accordingly, to accomplish high speed driving capabilities, the dimensions of the transistor widths within the second one-shot signal generating circuit 404, which generates the internal clock signal φ5, may be relatively large. In contrast, transistor widths within the first one-shot signal generating circuit 402 may be relatively small.

The third initial circuit 300, which is situated upstream from the second one-shot signal generating circuit 404 can also be large. As a result, current consumption, due to charging and discharging of nodes within the third initial circuit 300 and second one-shot signal generating circuit 404 can become relatively large, allowing for relatively fast operating speeds.

In the particular example of FIG. 7, when a synchronous semiconductor memory is in a power-down mode, the first initial circuit 200 and first one-shot signal generating circuit 402 will be active, while the remaining circuits are inactive. This can reduce current consumption considerably. Further, because the load capacitance for the one-shot signal generating circuit 402 is relatively small. This can allow for the transistor widths within the first one-shot signal generating circuit 402 to be smaller than conventional approaches, reducing current consumption further. Because the first one-shot signal generating circuit 402 can include smaller transistors, the first initial circuit 102, which is situated upstream from the first one-shot signal generating circuit 402, can also include smaller transistor widths. This can also reduce current consumption.

In this way a synchronous semiconductor memory can include circuits that enable operation in synchronism with an external clock signal, with such circuits including smaller sized devices. Such smaller sized devices can reduce current consumption.

As one example, stand-by current in a power-down mode was compared between one embodiment and a conventional synchronous semiconductor memory having the same transistor arrangement (but with larger sized transistors). The stand-by current of a conventional synchronous semiconductor memory was 1180 nA whereas the stand-by current of a synchronous semiconductor memory according to a present invention was 540 nA, or about 50% of the conventional case.

The above described performance advantages may provide benefits for portable devices having battery power supplies. In particular, battery lifetime in a stand-by state may be doubled. Consequently, significant improvements are expected for portable devices that utilize the teachings of the present invention, such as portable devices that mount one or more synchronous semiconductor memories according to the present invention.

One skilled in the art would realize that while the disclosed embodiments illustrate clock control circuits that may be utilized with a synchronous semiconductor memory, other synchronous devices may benefit from the teachings set forth herein. It is thus understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A synchronous semiconductor memory that can receive an external clock signal and a clock enable signal and generate an internal clock signal that operates in synchronism with the external clock signal, the synchronous semiconductor memory comprising:

a first initial circuit that can receive the external clock signal, compare the external clock signal with a first reference node voltage, and amplify and output a first comparison result;

a second initial circuit that can receive the clock enable signal, compare the clock enable signal with a second reference node voltage, and amplify and output a second comparison result;

a third initial circuit that is activated by a control signal controlled by the clock enable signal, the third initial circuit receiving the external clock signal, comparing the external clock signal with a third reference node voltage, and amplifying and outputting a third comparison result; and a first control circuit that generates a period signal that varies in synchronism with the output of the first initial circuit, and generates the internal clock signal in correspondence with the output of the third initial circuit.

2. The synchronous semiconductor memory of claim 1, wherein:

the first initial circuit includes a plurality of transistors; and the third initial circuit includes a plurality of transistors, the transistors of the third initial circuit having smaller channel widths than channel widths of corresponding transistors of the first initial circuit.

3. The synchronous semiconductor memory of claim 1, further including:

a second control circuit that can receive the output of the second initial circuit and generate an output signal in synchronism with the period signal, and delayed with respect to the output of the second initial circuit by at least one half-cycle of the external clock signal.

4. The synchronous semiconductor memory of claim 3, further including:

a third control circuit that can generate the control signal in correspondence with the output of the second control circuit and the second initial circuit.

5. The synchronous semiconductor memory of claim 1, wherein:

the first control circuit includes a first one-shot signal generating circuit that generates a one-shot signal that corresponds to the output of the first initial circuit, the one-shot signal from the first one-shot signal generating circuit being the period signal.

6. The synchronous semiconductor memory of claim 5, wherein:

the one-shot signal from the first one-shot signal generating circuit has a generally constant pulse width.

7. The synchronous semiconductor memory of claim 5, wherein:

the first control circuit further includes a second one-shot signal generating circuit that generates a one-shot signal of a constant pulse width that corresponds to the output of the third initial circuit and the output of the second control circuit, the one-shot signal from the second one-shot signal generating circuit being the internal clock signal.

8. The synchronous semiconductor memory of claim 7, wherein:

the one-shot signal from the second one-shot signal generating circuit has a generally constant pulse width.

9. The synchronous semiconductor memory of claim 7, wherein:

the second one-shot signal generating circuit includes a plurality of transistors, and the first one-shot signal generating circuit includes a plurality of transistors having smaller channel widths than channel widths of corresponding transistors in the second one-shot signal generating circuit.

10. The synchronous semiconductor memory of claim 1, further including:

at least one other initial circuit that can receive at least one other external signal, compare the other external signal with a reference voltage, and amplify and output a fourth comparison result, the other initial circuit being activated by the control signal.

11. A clock control circuit, comprising:

a first initial circuit that can receive a periodic external clock signal and generate a periodic first initial output signal;

a second initial circuit that can receive a clock enable signal and generate an internal clock enable signal;

a third initial circuit that can receive the periodic external clock signal and generate a periodic third initial output signal;

a first control circuit that can receive the first initial output signal and generate a periodic period signal in response thereto, the first control circuit also receiving the third initial output signal and generating a periodic internal clock signal, the internal clock signal being maskable according to a delayed enable signal; and a second control circuit that can receive the internal clock enable signal and generate the delayed enable signal, the delayed enable signal being delayed with respect to the internal clock enable signal by at least one half-cycle of the external clock signal.

12. The circuit of claim 11, wherein:

the first initial circuit includes a plurality of compare transistors that compare the external clock signal with a first reference voltage; and the third initial circuit includes a plurality of compare transistors that compare the external clock signal with a second reference voltage, the compare transistors of the third initial circuit having larger channel widths than channel widths of compare transistors of the second initial circuit.

13. The circuit of claim 11, wherein:

the first control circuit includes a first one-shot signal generating circuit that receives the first initial output signal and generates pulses in response to predetermined transitions in the first initial output signal, the first one-shot signal generating circuit including a number of first one-shot transistors; and a second one-shot signal generating circuit that is enabled by the delayed enable signal, the second one-shot signal generating circuit receiving the third initial output signal and generating pulses in response to predetermined transitions in the third initial output signal, the second one-shot signal generating circuit including a number of second one-shot transistors that have larger channel widths than corresponding channel widths of the first one-shot transistors.

14. The circuit of claim 11, further including:

a third control circuit that receives the delayed enable signal and the internal clock enable signal and generates a control signal; and the third initial circuit is enabled by the control signal.

15. A clock circuit for a synchronous integrated circuit device, the clock circuit, comprising:

a first initial circuit that can receive an external clock signal and compare the external clock signal to a first reference voltage to generate a first initial output signal;

a third initial circuit that is enabled by a control signal, the third initial circuit receiving the external clock signal and comparing the external clock signal to a second reference voltage to generate a third initial output signal when enabled; and a third control circuit that receives a delayed clock signal that is delayed with respect to the external clock signal and an internal clock enable signal and generates the control signal.

16. The clock circuit of claim 15, wherein:

the first initial circuit includes a first current mirror circuit having a first node and a second node, a first compare transistor having an impedance path that is controlled by a control terminal, the first compare transistor impedance path being coupled to the first node, the first compare transistor control terminal being coupled to the first reference voltage, and a second compare transistor having an impedance path that is controlled by a control terminal, the second compare transistor impedance path being coupled to the second node, the second compare transistor control terminal being coupled to the external clock signal.

17. The clock circuit of claim 16, wherein:

the third initial circuit includes a second current mirror having a third node and a fourth node, a third compare transistor having an impedance path that is controlled by a control terminal, the third compare transistor impedance path being coupled to the third node, the third compare transistor control terminal being coupled to the second reference voltage, and a fourth compare transistor having an impedance path that is controlled by a control terminal, the fourth compare transistor impedance path being coupled to the fourth node, the fourth compare transistor control terminal being coupled to the external clock signal; wherein the first, second, third, and fourth compare transistors are field effect transistors having channels, the channel widths of the third and fourth compare transistors are at least two times the channel widths of the first and second transistors.

18. The clock circuit of claim 17, wherein:

the third initial circuit further including a disable transistor having an impedance path that is controlled by a control terminal, the disable transistor being coupled to the fourth node and the disable transistor control terminal being coupled to the control signal.

19. The clock circuit of claim 15, wherein:

the first initial circuit includes a first reference transistor having an impedance path that is controlled by a control terminal, the first reference transistor impedance path being coupled to the impedance paths of the first and second compare transistors, the first reference transistor control terminal being coupled to the first reference voltage; and the third initial circuit includes a second reference transistor having an impedance path that is controlled by a control terminal, the second reference transistor impedance path being coupled to the impedance paths of the third and fourth compare transistors, the second reference transistor control terminal being coupled to the second reference voltage.

20. The clock circuit of claim 15, further including:

a first control circuit that includes a first one-shot signal generating circuit having a first logic gate with one input coupled to the first initial output signal and a second input coupled to the first initial output signal by a first delay path, and a second one-shot signal generating circuit having a second logic gate with one input coupled to the third initial output signal and a second input coupled to the third initial output signal by a delay path; wherein the first one-shot signal generating circuit and the second one-shot signal generating circuit include field effect transistors, selected field effect transistors of the second one-shot signal generating circuit having larger channel widths than channel widths of corresponding transistors of the first one-shot signal generating circuit.

* * * * *